Nov. 5, 1968 R. J. MUNN 3,409,841

METHOD OF TEMPERATURE COMPENSATING A CRYSTAL OSCILLATOR

Filed Feb. 9, 1967

Inventor
ROBERT J. MUNN.

BY Mueller, Aichele & Rauner

ATTYS.

United States Patent Office 3,409,841
Patented Nov. 5, 1968

3,409,841

METHOD OF TEMPERATURE COMPENSATING A CRYSTAL OSCILLATOR

Robert J. Munn, Hillside, Ill., assignor to Motorola, Inc., Franklin Park, Ill., a corporation of Illinois Filed Feb. 9, 1967, Ser. No. 614,990
4 Claims. (Cl. 331—44)

ABSTRACT OF THE DISCLOSURE

An oscillator having a temperature compensating network wherein at least one fixed impedance element is adjusted to reduce the frequency error versus temperature to a minimum value. The temperature of the oscillator is stabilized at a desired value and the output signal therefrom is mixed with a reference signal. The mixing process produces an error signal proportional to the frequency difference between the oscillator output signal and the reference signal. The value of the impedance element is changed to reduce the error signal to a minimum value. The method can be used to permanently alter the value of fixed components and can also be automated.

*References*

The process of altering the resistance of a thin film resistor, disclosed in the application of Everett Eberhard et al., filed Apr. 11, 1966, Ser. No. 541,639, is particularly useful in carrying out the process of this invention.

*Background of the invention*

Crystals used to control the output frequency of crystal oscillators have resonant frequencies which vary with temperature. When it is desired to control the output frequency of an oscillator to a high degree of accuracy, means must be provided for compensating for this change in the resonant frequency of the crystal with temperature. One method of stabilizing the crystal is to enclose it in an oven which maintains the ambient temperature at a constant level. Crystal ovens are relatively complex devices and use costly circuit elements. In addition, ovens are relatively large in size and consume large amounts of power, an undesirable feature in miniaturized semiconductor circuits where it is desirable to reduce power requirements to as low a value as possible.

Temperature compensating networks have been provided to regulate the frequency of the crystal oscillator with changes in temperature. In some devices the impedance elements of the temperature compensating networks are chosen by computer calculation of the values to be used to increase the accuracy of the oscillator. This increases cost and requires that many different component values be stocked. Even with the computer calculated compensation network the best accuracy is not achieved.

*Summary*

Accordingly, it is an object of this invention to provide an improved method for temperature compensating a crystal oscillator having a temperature compensating network by changing the values of the impedance elements used in the temperature compensating network.

Another object of this invention is to provide a method for temperature compensating a crystal oscillator in which the temperature compensation can be carried out automatically.

Another object of this invention is to provide a method for temperature compensating a crystal oscillator having a temperature compensating network using fixed impedance elements, wherein the values of the fixed impedance elements are permanently changed.

In practicing this invention a crystal oscillator is provided having a voltage variable capacitor coupled to the crystal. A control voltage applied to the voltage variable capacitor acts to change the resonant frequency of the oscillator. A temperature compensation network is provided and is responsive to the temperature of the crystal to produce a control voltage which is coupled to the voltage variable capacitor to select the proper capacitance value.

In the process of adjusting the compensation network, the crystal oscillator is stabilized at a desired temperature and the output signal therefrom is mixed with a stable reference signal. An error signal is developed which is proportional to the difference in frequency between the oscillator output signal and the reference signal. Certain fixed value components of the temperature compensation network are positioned adjacent cutting means such as an abrasive disc or an air driven abrasive. The cutting means is automatically operated to change the value of the fixed value component. As the value of the component changes the error signal is reduced to a minimum value. When the error signal reaches a minimum value, the operation of the cutting means is stopped, the temperature of the oscillator is changed to a new temperature and a different fixed value component of the network is positioned adjacent the cutting means. This process is carried out as many times as is desired to temperature compensate the oscillator.

The process may also be carried out by etching the components or by the pulsing of thin film resistors. Variable components may be used in place of the fixed value components to adjust the temperature compensating network.

The invention is illustrated in the drawings of which:

*Description*

Figure 1:
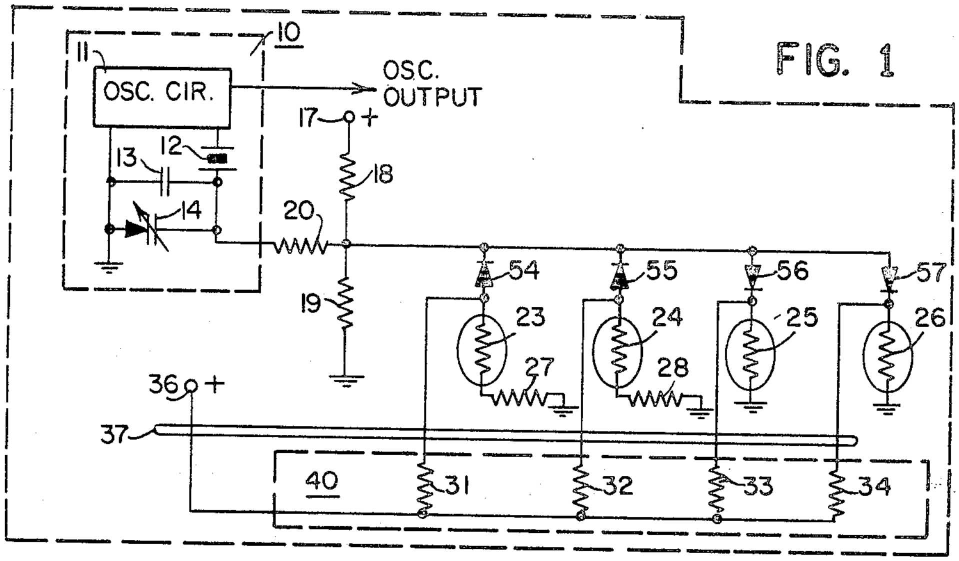
FIG. 1 is a partial block diagram and partial schematic of an oscillator circuit having a temperature compensating network adapted to be modified by the process of this invention.

In FIG. 1 there is shown a partial schematic and partial block diagram of an oscillator which is particularly adaptable for temperature compensation by the method of this invention. An oscillator and temperature compensation network 39 is provided including an oscillator 10. Oscillator 10 has oscillator circuit 11 which may consist of feedback networks and amplifier circuitry. A frequency determining network for the oscillator is also provided and consists of a crystal 12, capacitor 13 and voltage variable capacitor 14. Crystal 12 is subject to frequency variations with temperature which must be compensated for in order to provide a stable frequency output from the oscillator. This is accomplished by changing the voltage applied to voltage variable capacitor 14 in a manner which changes the capacitance thereof to offset the change in the resonant frequency of crystal 12 with temperature.

Voltage variable capacitor 14 is biased by a direct current provided from a voltage divider network consisting of resistors 18 and 19 connected between supply voltage terminal 17 and ground. Resistor 20 couples the voltage divider network to the voltage variable capacitor 14. In addition a series of voltage divider networks, consisting of thermistors 23 to 26, resistors 27, 28 and 31 to 34 and diodes 54 to 57, are provided and are connected in parallel with the voltage divider of resistors 18 and 19. Thermistors 23–26 are temperature sensitive and act to provide a temperature compensation voltage to voltage variable capacitor 14.

Diodes 54 and 55 are connected with their polarity reversed from that of diodes 56 and 57. The voltage dividers of which diodes 54 and 55 are a part provide cold temperature compensation while the divider networks of which diodes 56 and 57 are a part provide high temperature compensation.

In operation, with the oscillator stabilized at a center temperature, the values of thermistors 23–26 and resistors 31–34 are chosen so that diodes 54–57 are all biased to non-conduction. As the temperature decreases the resistance of each of the thermistors 23–26 increases thus increasing the voltage at the output of the voltage divider. As the voltage increases diodes 56 and 57 are biased further into non-conduction while diodes 54–55 are biased toward conduction. The values of the components are chosen so that one diode, for example diode 54 will conduct before diode 55. With diode 54 conducting an additional voltage divider network is placed across the circuit and the DC voltage applied to voltage variable capacitor 14 increases changing the value of the capacitance of this component. As the capacitance increases the resonant frequency of the frequency determining circuit is changed to offset the changes in frequency caused by the changes in the resonant frequency of crystal 12 with temperature.

As the temperature increases from the center temperature diodes 54 and 55 are biased further toward non-conduction and diodes 56 and 57 are biased toward conduction. The values of the components are chosen so that one diode, for example diode 56 conducts before diode 57. With diode 56 conducting, the voltage applied to voltage variable capacitor 14 is reduced. As the temperature increases still further, diode 57 conducts and the voltage applied to voltage variable capacitor 14 is still further reduced. While four temperature compensating voltage divider networks have been shown, the compensating circuit is not limited to this number and any number required may be used.

The temperature characteristics of crystal 12 have been found to vary from crystal to crystal so that for a highly stable oscillator circuit the same voltage divider network cannot be used for temperature compensating different oscillators. Thus it has been found necessary to tailor the voltage divider network specifically for each crystal used. This has proven to be a problem, particularly in the manufacture of large quantities of highly stable and highly accurate crystal oscillators. In one example of the method of this invention, fixed valued components are used with the same component values being used in each oscillator. After the oscillator has been constructed, the fixed values of the resistors 31–34 are permanently altered to achieve the best temperature compensation.

Figure 2:
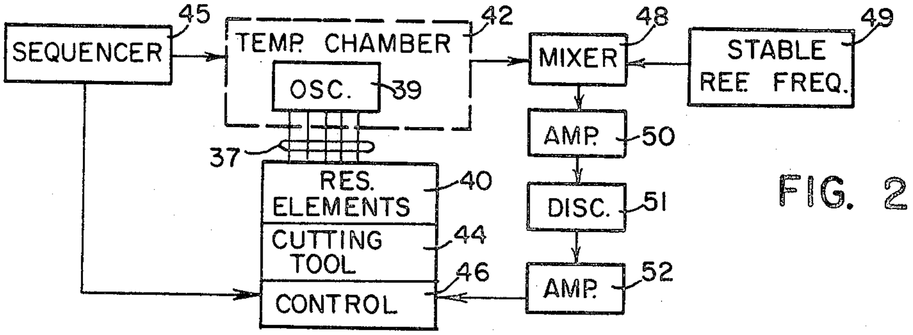
FIG. 2 is a block diagram illustrating the operation of the process of this invention.

In FIG. 2 there is shown a method for automatically temperature compensating oscillator 39. Oscillator 39 is positioned within temperature chamber 42, except for resistance elements 40 which are positioned outside of the chamber and connected to the temperature compensating network within the chamber by wires 37. Resistors 31–34 of FIG. 1 are relatively insensitive to changes in temperature and therefore positioning these resistors outside of temperature chamber 42 will not appreciably affect the operation of the temperature compensation network. Since the voltages used in the temperature compensating network are direct current voltages, the resistance elements 40 may be positioned away from the temperature compensating oscillator network of oscillator 39 without affecting the operation of the temperature compensating network.

Sequencer 45 automatically changes the temperature of chamber 42 to the desired value. For example, a temperature which is lower than the central operating temperature of oscillator 39, may be selected. At this temperature it is desired that diode 54 become conductive to compensate for the change in frequency of crystal 12 of FIG. 1.

The output of oscillator 39 is coupled to mixer 48 and mixed with a stable reference frequency 49. The resulting difference frequency is an error signal which is amplified in amplifier 50 and detected in discriminator 51. The output of discriminator 51 is further amplified in amplifier 52 and coupled to control unit 46. Control unit 46 also is coupled to sequencer 45 to receive information as to the temperature and resistance element which is to be changed.

Control unit 46 operates cutting means 44 which is positioned adjacent resistor 31. Cutting means 44 mechanically changes the resistance of resistor 31. The change in the resistance of resistor 31 adjusts the temperature compensating network to compensate for the change in frequency of crystal 12 thereby reducing the error signal from mixer 48. When the error signal is reduced to zero or a minimum value, the operation of cutting means 44 is stopped. Sequencer 45 then changes the temperature of temperature chamber 42 and another resistor is positioned adjacent cutting means 44. The process is repeated until the oscillator 39 is compensated throughout its operating temperature range.

Figure 3:
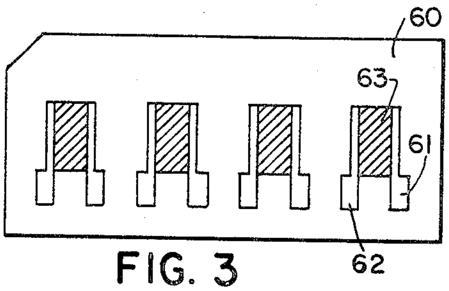
FIG. 3 is a drawing showing a set of resistors adapted to be modified to change their fixed value.

In FIG. 3 there is shown a resistor board, including four resistors, which is particularly adapted for use in this method. Each of the resistors is deposited on a ceramic substrate 60 and consists of a pair of electrodes 61 and 62 separated by resistive material 63. The amount of resistive material 63 positioned between electrodes 61 and 62 determines the value of the resistor. Wires are attached to electrodes 61 and 62 for connection to the remainder of the temperature compensating network.

Figure 4:
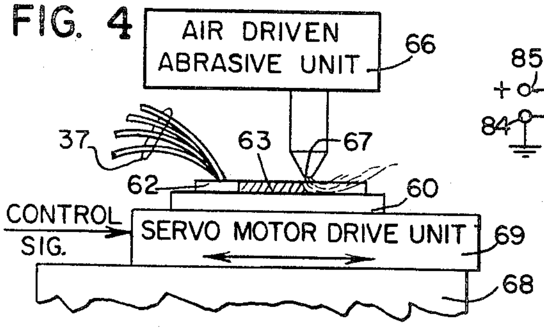
FIG. 4 is a drawing showing an air driven abrasive unit adapted to change the resistors of FIG. 3 to alter their fixed value.

In FIG. 4 there is shown an air driven abrasive unit particularly adapted for modifying the resistive value of the resistors shown in FIG. 3. Ceramic substrate 60 is positioned on the servo-motor drive unit 69 with wires 37 coupled to the oscillator compensating network. An air driven abrasive unit 66 is provided which uses air under pressure to force abrasive material against the resistive material 63. The abrasive material from nozzle 67 erodes and removes resistive material 63 increasing the resistance value of the resistor. Servo motor drive unit 69, controlled by control unit 46, moves the resistor under nozzle 67 as required to remove continuously the resistive material 63. When the resistive value of resistance 63 has been increased to the point where the frequency of the crystal oscillator is at the desired value, the error signal is reduced to a minimum and the control unit 46 acts to prevent further removal of the resistive material 63.

Figure 5:
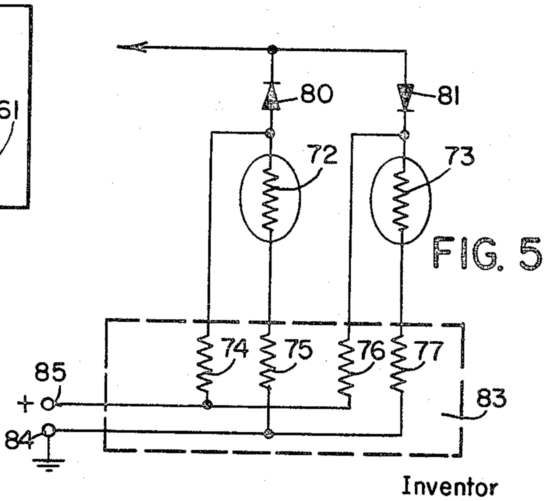
FIG. 5 is a schematic of a portion of a temperature compensating network.

In FIG. 5 there is shown a portion of the temperature protective circuit in which fixed value resistor 74 and 76 appear in one arm of the voltage divider while fixed resistors 75 and 77 are positioned in the other arm of the voltage divider. Thus the removal of the material from resistor 74 or 76 increases the resistances of these resistors to decrease the potential appearing at the output of the voltage dividers while removal of material from resistors 75 and 77 will increase the resistance of these resistors increasing the potential at the output of the voltage divider. By this means the potential across diodes 80 and 81 can be moved up or down as desired at each particular temperature point.

In the example of the process described in this application an air driven abrasive material is used to remove material from resistors to increase their resistance. However, the process is not limited to an air driven abrasive material and other means may be used to change the resistance value of the fixed resistor. For example, grinding wheels, sanding discs, and etching materials may be used. The process may also be carried out with any type of components from which material may be removed to change their impendance value. The component alteration may be carried out manually or by the use of automotive machinery. Also variable components may be used in place of the fixed components.

The process disclosed in the application of Everett Eberhard et al., Ser. No. 541,639 is particularly adapted to be used with this invention. In the disclosure of Eberhard et al., electrical pulses are applied to a thin film resistor such as zirconium, aluminum, tantalum, chromium, nickel and nichrome. The electrical pulses have a moderate duty cycle and a peak power which may be many times greater than the normal operating pulse. For example, the pulse may be from 4 to 20 times the normal recommended operating current and have a peak power dissipation from 16 to 400 times the recommended operating power. When the pulses are applied to a thin film resistor in open air or an oxidizing atmosphere an oxidation reaction occurs at the surface of the resistor which increases its resistance. The resistance of the resistor may be decreased by pulsing the thin film resistor in an oxygen deficient or reducing atmosphere causing the reduction reaction to occur which decreases the resistance.

I claim:

1. A method of temperature compensating a crystal oscillator having a temperature compensating network with at least one resistor therein including the steps of:

(a) establishing the temperature of the oscillator at a particular value, (b) mixing the output signal of the oscillator with a reference signal to generate an error signal proportional to the difference between the frequency of the reference signal and the oscillator output signal, (c) measuring the magnitude of said error signal, (d) changing the value of said resistor by physically removing a portion thereof, and (e) continuing said removal of a portion of said resistor to change the magnitude of said error signal to a predetermined value at said particular temperature value.

2. The method of temperature compensating the crystal oscillator of claim 1 wherein said steps of changing the value of said resistor include the steps of:

(a) directing a stream of abrasive material against said resistor by means of a gas under pressure to remove a portion thereof, and (b) continuing said removal of a portion of said resistor to reduce the magnitude of said error signal to a minimum value.

3. A method of temperature compensating at a plurality of temperatures a crystal oscillator having a temperature compensating network with a plurality of resistors therein including the steps of:

(a) consecutively establishing the temperature of the oscillator at each of the plurality of temperature values, (b) with said ambient temperature held constant at each of said plurality of temperature values, mixing the output signal of the oscillator with a reference signal to generate an error signal proportional to the difference between the frequency of the reference signal and the oscillator output signal, (c) measuring the magnitude of said error signal, (d) changing the value of a separate one of said plurality of resistors at each of said temperature values by physically removing a portion thereof, and (e) continuing said removal of a portion of said resistor to change the magnitude of said error signal to a predetermined value at each of said temperature values.

4. The method of temperature compensating the crystal oscillator of claim 3 wherein said steps of changing the value of each of said resistors include the steps of:

(a) directing a stream of abrasive material against said resistor being changed by means of a gas under pressure to remove a portion thereof, and (b) continuing said removal of a portion of said resistor to reduce the magnitude of said error signal to a minimum value.

References Cited

UNITED STATES PATENTS

| | | | |
|---|---|---|---|
| 2,535,248 | 12/1950 | Wild | 331—65 |
| 2,721,267 | 10/1955 | Collins | 331—64 |
| 3,176,244 | 3/1965 | Newell et al. | 331—116 |
| 3,322,981 | 5/1967 | Brenig | 331—116 |
| 3,349,348 | 10/1967 | Ice | 331—116 |

FOREIGN PATENTS

| | | |
|---|---|---|
| 42,987 | 1/1934 | France. |

JOHN KOMINSKI, *Primary Examiner.*